United States Patent [19]

Jun

[11] Patent Number: 5,798,965
[45] Date of Patent: Aug. 25, 1998

[54] DYNAMIC RANDOM ACCESS MEMORY HAVING NO CAPACITOR AND METHOD FOR FABRICATING THE SAME

[75] Inventor: Young Kwon Jun, Seoul-si, Rep. of Korea

[73] Assignee: LG Semicon Co., Ltd., Chungcheongbuk-Do, Rep. of Korea

[21] Appl. No.: 708,743

[22] Filed: Sep. 5, 1996

[30] Foreign Application Priority Data

Apr. 12, 1996 [KR] Rep. of Korea ............... 11065/1996

[51] Int. Cl.$^6$ .................................................. G11C 7/00
[52] U.S. Cl. .................................................... 365/150
[58] Field of Search ............................ 365/150, 189.09, 365/149

[56] References Cited

U.S. PATENT DOCUMENTS

| | | | |
|---|---|---|---|
| 3,771,148 | 11/1973 | Aneshamsley | 365/150 X |
| 4,716,548 | 12/1987 | Mochizuki | 365/150 X |
| 5,122,986 | 6/1992 | Lim | 365/150 X |
| 5,282,162 | 1/1994 | Ochii | 365/150 X |
| 5,448,513 | 9/1995 | Hu et al. | 365/150 |

OTHER PUBLICATIONS

"A Capacitorless DRAM Cell on SOI Substrate", Wann et al., IEDM 93, pp. 635–638, 1993.

*Primary Examiner*—Do Hyun Yoo
*Attorney, Agent, or Firm*—Morgan, Lewis & Bockius LLP

[57] ABSTRACT

A capacitor-less dynamic random access memory (DRAM) having a unit cell includes a first transistor receiving data through a source electrode connected to a bit line according to a signal level applied to a gate electrode, and a second transistor storing charges corresponding to data input to the first transistor and outputting a reference voltage to the bit line according to the level of the charges. This improves the reliability and integration of the device.

2 Claims, 15 Drawing Sheets

FIG.4d
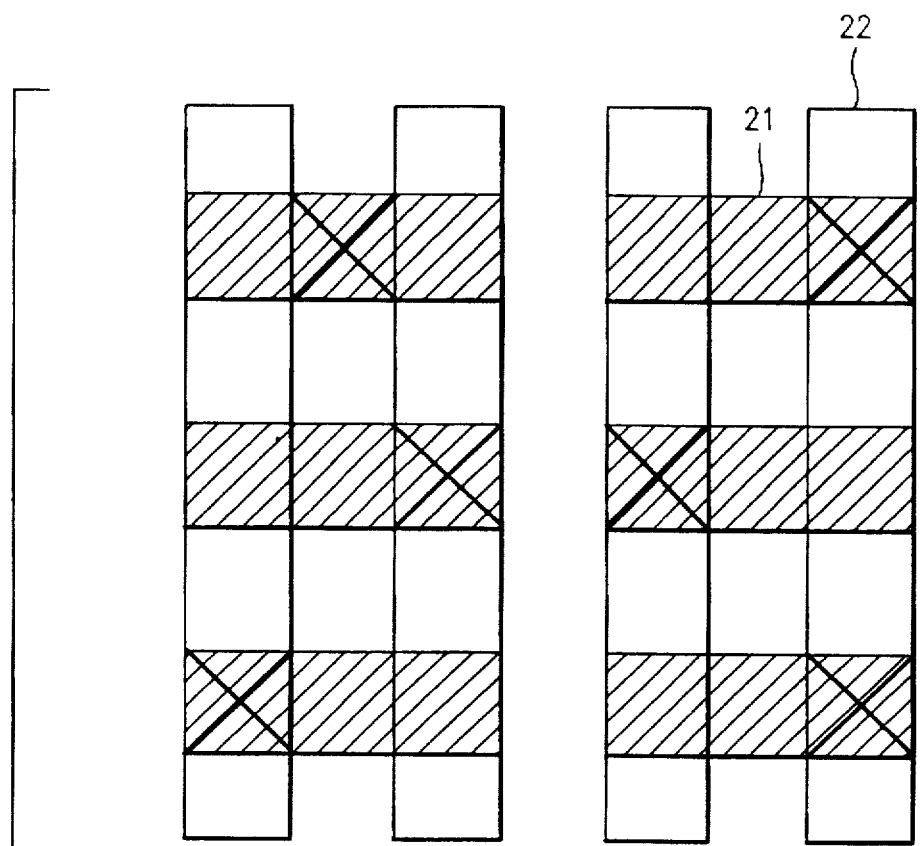
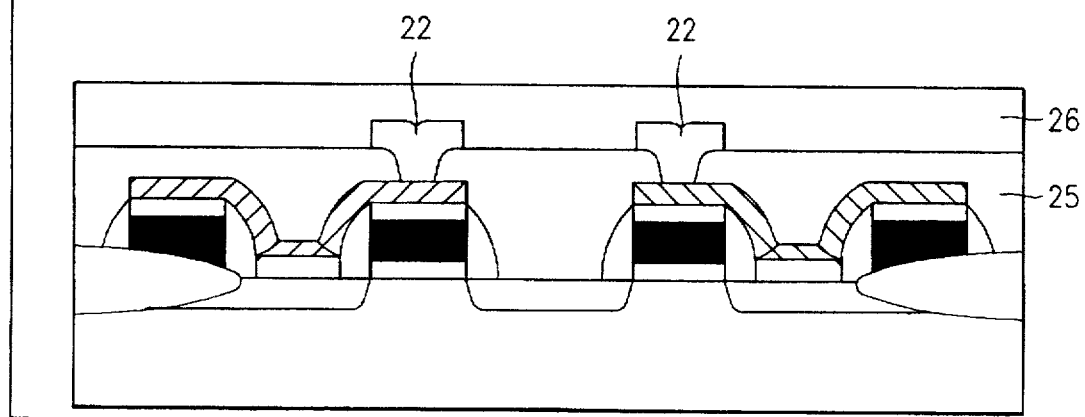

FIG.5a write cycle

| write cycle | bit line | second transistor gate |
|---|---|---|
| H | H | H |
| H | L | L |
| L | H | L |
| L | L | L |

FIG.5b standbay cycle

| second transistor gate | word line | bit line |
|---|---|---|
| H | L | L |
| L | L | L |

FIG.5c read cycle

| reference voltage supply line | second transistor gate | bit line |
|---|---|---|
| H | H | H |
| H | L | L(OPEN) |
| L | H | L |
| L | L | L(OPEN) |

FIG.8e
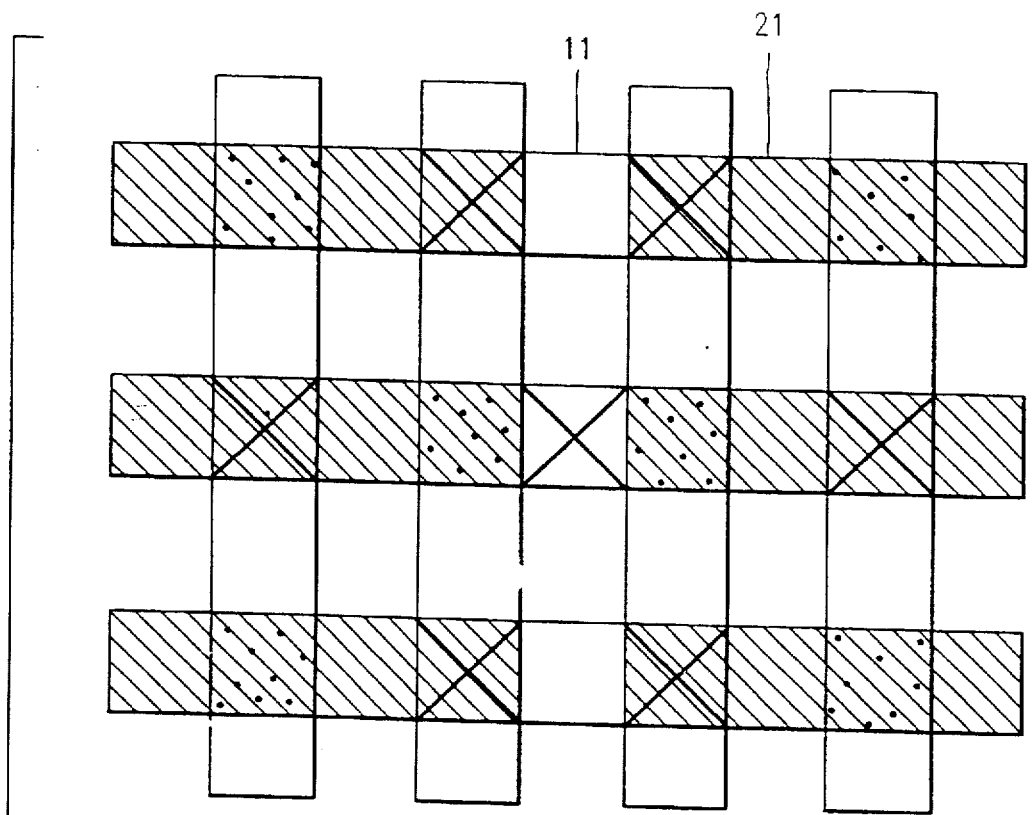
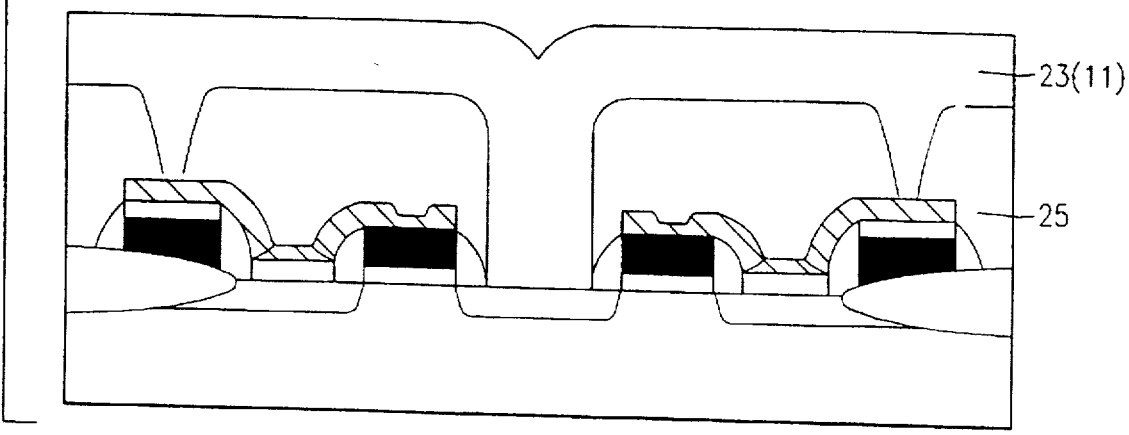

DYNAMIC RANDOM ACCESS MEMORY HAVING NO CAPACITOR AND METHOD FOR FABRICATING THE SAME

BACKGROUND OF THE INVENTION

1. Field of the Invention

The present invention relates to a dynamic random access memory (DRAM), and more particularly, to a DRAM having no capacitor and a method for fabricating the same in which the DRAM cell is constructed of a transistor having no capacitor.

2. Discussion of the Related Art

A DRAM has a simple structure in which a cell conventionally consists of one transistor and one capacitor, and thus has a large capacitance but low production cost. Accordingly, DRAMS are widely employed in various electronic products, including computers, and their application has become ever wider. Recently, the operation speed and capacity of computers leading the DRAM market have increased, requiring higher integration of the DRAM. However, since process techniques applied to the production of DRAM, such as optical lithography using ultraviolet light, is reaching its technical limits, it is difficult to expect higher integration of DRAM cells of the type having one transistor/capacitor structure.

A conventional DRAM cell will be explained below with reference to the accompanying drawings. FIG. 1 is a circuit diagram of a conventional DRAM cell. The conventional DRAM cell having one transistor/capacitor consists of a bit line, a word line, an access transistor, a storage capacitor, and a sensing amplifier (not shown). The gate of the access transistor is connected to the word line, and the source and drain electrodes thereof are connected to the storage capacitor and the bit line, respectively. A cell plate electrode of the capacitor is connected to a reference voltage supply. The bit line is connected to one input terminal of the sensing amplifier, and the other input terminal thereof is connected to the reference voltage supply. When the access transistor is in the on-state, charge information from the bit line is stored in the storage capacitor through the source and drain electrodes. When the access transistor returns to the on-state again, the stored charge information in the storage capacitor is transmitted to the bit line through a path between the source and drain. According to the comparison of a signal voltage of charge information with the reference voltage of the bit line, a logic state of charge information stored in the capacitor is determined.

The capacitor of a DRAM cell conventionally consists of storage and plate electrodes formed of n+ polysilicon, and a dielectric layer therebetween. The reading and writing operations of charge information in a DRAM cell having the above-described capacitor will be explained below in detail. Here, (½)Vcc is applied to the plate electrode. When there is no information in the storage electrode, electrons are redistributed on the surface of the storage electrode located beneath the dielectric layer according to the voltage applied to the plate electrode. This results in the formation of an electron-depletion layer at the interface between the dielectric layer and storage electrode. Here, in the case where information data '1' is written, Vcc is applied to the bit line and word line. Accordingly, the gate electrode voltage and source electrode voltage of the access transistor are increased to the Vcc level so that the access transistor is in the on-state.

Here, since a voltage (½)Vcc−Δ (where (½)Vcc is the cell plate electrode voltage, and Δ is the voltage drop amount due to the dielectric layer) is applied to the storage electrode, electrons are moved from the storage electrode at a high electron potential to the source electrode at a low electron potential, thereby extending the electron-depletion layer in the storage electrode. At this time, if the word line voltage is decreased to a ground potential, the depletion layer remains in the storage electrode. This state indicates a binary code '1'.

In the case where information data '0' is written in the memory cell, the bit line voltage becomes the ground potential and Vcc is applied to the gate of the access transistor. Accordingly, the storage electrode voltage ((½)Vcc−Δ) becomes higher than the source electrode voltage of 0V so that electrons are moved from the source electrode at a high electron potential to the storage electrode at a low electron potential. By doing so, electrons are accumulated in the storage electrode, thereby restoring the depletion layer back into an accumulation layer. Here, if the word line voltage is decreased to the ground potential, electrons remain in the storage electrode. This state indicates a binary code '0'.

The reading operation of information stored in a DRAM cell will be explained below. First, Vcc is applied to the word line when the bit line is pre-charged at (½)Vcc. By doing so, the access transistor is in the on-state so that information stored in the storage electrode of the capacitor appears in the bit line, and the bit line voltage is changed according to the stored charge amount. This changed voltage is compared with the reference voltage which appears in the bit line of a dummy cell through a comparator circuit such as sensing amplifier (not shown), and the voltage difference obtained by the comparison is amplified. If the bit line voltage is higher than the reference voltage, then a logic '1' is determined. If the bit line voltage is lower than the reference voltage, then a logic '0' is determined. Here, the voltage difference ΔV between bit lines is about (½)Vcc·Cs/(Cs+Cb) (where Cs is the storage capacitance, and Cb is the bit line capacitance). Accordingly, as the ratio of Cs/Cb is larger, ΔV becomes larger, resulting in the reduction of discrimination error of the logic state.

However, the aforementioned conventional DRAM cell has the following problems. First, since the voltage difference between the bit line voltage and reference voltage that can be discriminated by the sensing amplifier is about 100 to 200 mV, it is desirable for the ratio γ(=Cs/Cb) of the storage capacitance to the bit line capacitance to be larger. However, if the packing density of the DRAM is increased, the cell area is remarkably reduced and neither the bit line capacity nor the sensitivity of the sensing amplifier is improved. Accordingly, the signal to noise ratio may decrease, and erroneous operation may occur.

Moreover, a soft error caused by the presence of the α-particle may reduce the reliability of DRAM. This soft error occurs as described below.

If an α-particle collides with the substrate, electron-hole pairs are generated according to the impact ionization, and minority carriers among these electron-hole pairs are captured in the storage electrode, thereby changing the state of the charges stored in the storage electrode. In order to prevent generation of the soft error caused by the α-particle, the conventional solution is to either increase the area of the storage electrode three-dimensionally, or form the dielectric layer with a material having a high dielectric constant.

However, if the area of the storage electrode is increased three-dimensionally, a severe uneven surface results, thereby making photolithography difficult. If the dielectric layer is formed of a material having a high dielectric constant, since it is difficult to form a thin dielectric layer having a high dielectric constant, the leakage current and breakdown voltage characteristics of such a thin dielectric layer are usually poor. This is not suitable for high integration of DRAM cell.

SUMMARY OF THE INVENTION

Accordingly, the present invention is directed to a dynamic random access memory having no capacitor and a method for fabricating the same that substantially obviates one or more of the problems due to limitations and disadvantages of the related art.

It is an object of the present invention to provide a DRAM having no capacitor and a method for fabricating the same in which a cell is made using a transistor having no capacitor, to thereby improve the packing density and reliability of the DRAM.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided a DRAM having no capacitor in which a unit cell comprises a first transistor receiving data through a source electrode connected to a bit line according to a signal level applied to a gate electrode, and a second transistor storing charges corresponding to data input to the first transistor and outputting a reference voltage to the bit line according to the level of the charges.

In another aspect a capacitor-less dynamic random access memory having a unit cell includes: a first transistor having a gate electrode and source and drain electrodes; and a second transistor having source and drain electrodes, the second transistor utilizing the drain electrode of the first transistor as its gate electrode.

In another aspect, the capacitor-less dynamic random access memory includes: a first transistor having a gate electrode and source and drain electrodes; a second transistor having a gate electrode and source and drain electrodes, wherein the drain electrode of the first transistor is used as the gate electrode of the second transistor; a word line connected to the gate electrode of the first transistor; a bit line commonly connected to the source electrode of the first transistor and the source electrode of the second transistor; and a reference voltage supplying line connected to the drain electrode of the second transistor.

In another aspect, the capacitor-less dynamic random access memory includes: a gate electrode formed on a semiconductor substrate; a first impurity-diffusion region formed in a portion of the semiconductor substrate at opposing sides of the gate electrode; a semiconductor layer formed over the gate electrode and first impurity-diffusion region; a second impurity-diffusion region formed in a portion of the semiconductor layer located over the gate electrode; a first metal line in contact with a first side of the second impurity-diffusion region; and a second metal line in contact with the first impurity-diffusion region and a second side of the second impurity-diffusion region.

In another aspect, the method of fabricating a capacitor-less dynamic random access memory includes the steps of: forming a gate electrode on a semiconductor substrate; forming a first impurity-diffusion region on an active region at opposing sides of the gate electrode; forming a semiconductor layer on the gate electrode and first impurity-diffusion region, the semiconductor layer being isolated from the gate electrode and the first impurity-diffusion region; forming a second impurity-diffusion region in a portion of the semiconductor layer located over the gate electrode; forming a first metal line to be connected to only a first side of the second impurity-diffusion region; and forming a second metal line to be connected to only one side of the first impurity-diffusion region and a second side of the second impurity-diffusion region.

In another aspect, the capacitor-less dynamic random access memory includes: a first transistor having a gate electrode and source and drain electrodes; a second transistor having a gate electrode and source and drain electrodes, wherein the drain electrode of the first transistor is used as the gate electrode of the second transistor; a word line connected to the gate electrode of the first transistor and the drain electrode of the second transistor; and a bit line commonly connected to the source electrode of the first transistor and the source electrode of the second transistor.

In another aspect, the capacitor-less dynamic random access memory includes: a gate electrode formed on a semiconductor substrate; a first impurity-diffusion region formed in a portion of the semiconductor substrate at opposing sides of the gate electrode; a semiconductor layer configured for selective connection to the gate electrode and formed over the gate electrode and the first impurity-diffusion region; a second impurity-diffusion region formed in a portion of the semiconductor layer located over the gate electrode; and a metal line connected to the first impurity-diffusion region and one side of the second impurity-diffusion region.

In a further aspect, the method of fabricating a capacitor-less dynamic random access memory includes the steps of: forming a gate electrode on a semiconductor substrate; forming a first impurity-diffusion region on an active region at opposing sides of the gate electrode; forming a semiconductor layer, configured for selective connection to the gate electrode, over the gate electrode and the first impurity-diffusion region; forming a second impurity-diffusion region in a portion of the semiconductor layer located over the gate electrode; and forming a metal line to be connected to only one side of the first impurity-diffusion region, and a side of the second impurity-diffusion region which is not connected to the gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3b is a cross-sectional view of a DRAM cell taken along line I–I' in FIG. 3a;

FIGS. 4a to 4e are cross-sectional views and layout views showing a process of fabricating a DRAM cell according to the first embodiment of the present invention;

FIGS. 5a, 5b and 5c are logic states according to programming of a DRAM cell;

FIG. 7b is a cross-sectional view of a DRAM cell taken along line II–II' in FIG. 7a; and FIGS. 8a to 8e are cross-sectional views and layout views showing a process of fabricating a DRAM cell according to the second embodiment of the present invention.

DETAILED DESCRIPTION OF THE PREFERRED EMBODIMENTS

Figure 1:
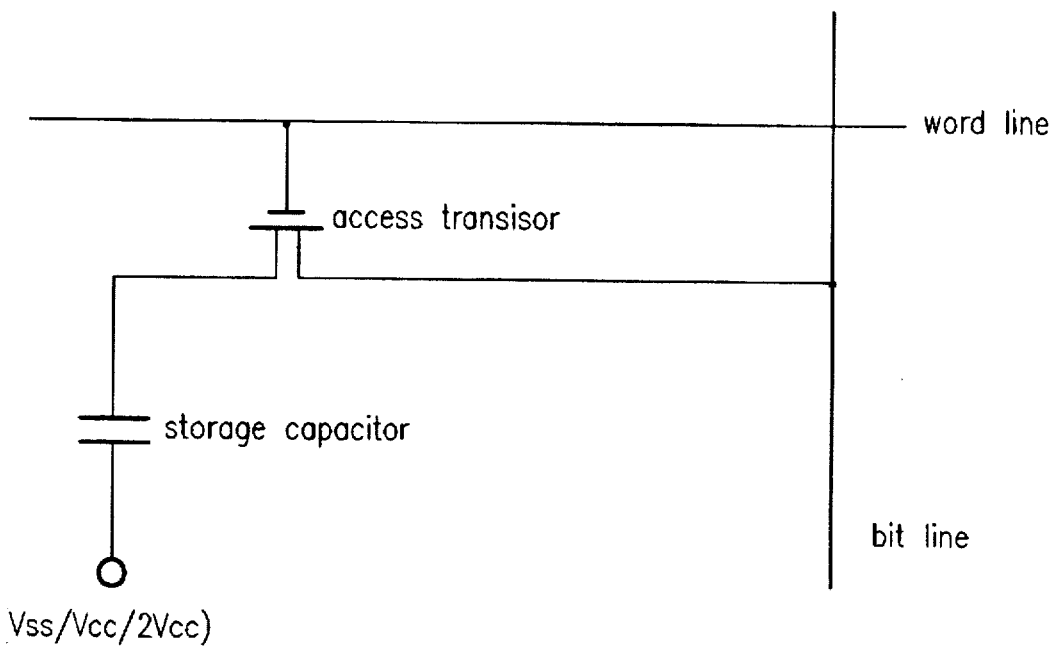
FIG. 1 is a circuit diagram of a conventional DRAM cell.

Reference will now be made in detail to the preferred embodiments of the present invention, examples of which are illustrated in the accompanying drawings. Throughout this description, like or similar parts are identified through the drawings by the same reference characters.

Figure 2:
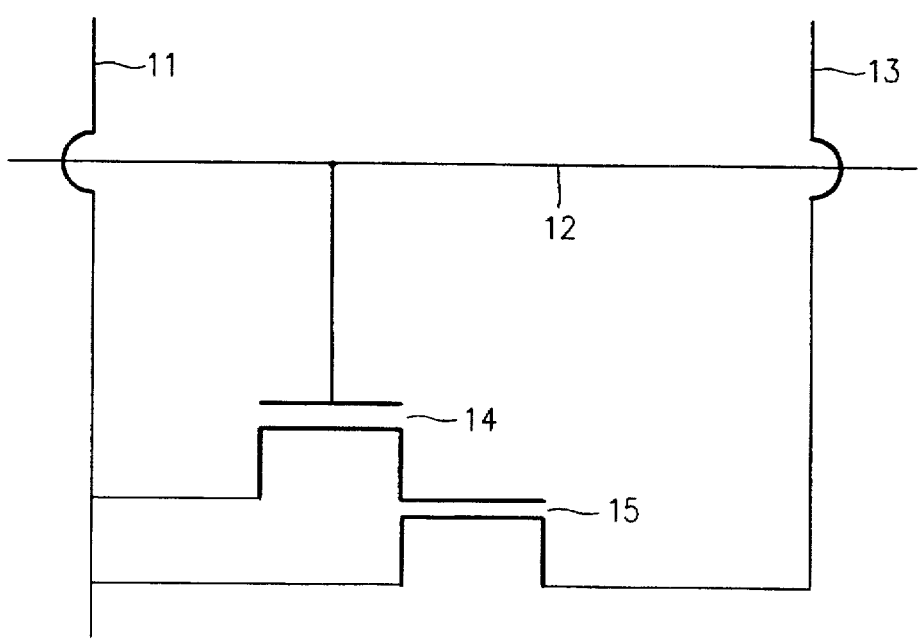
FIG. 2 is a circuit diagram of a DRAM cell according to a first embodiment of the present invention.
Figure 3A:
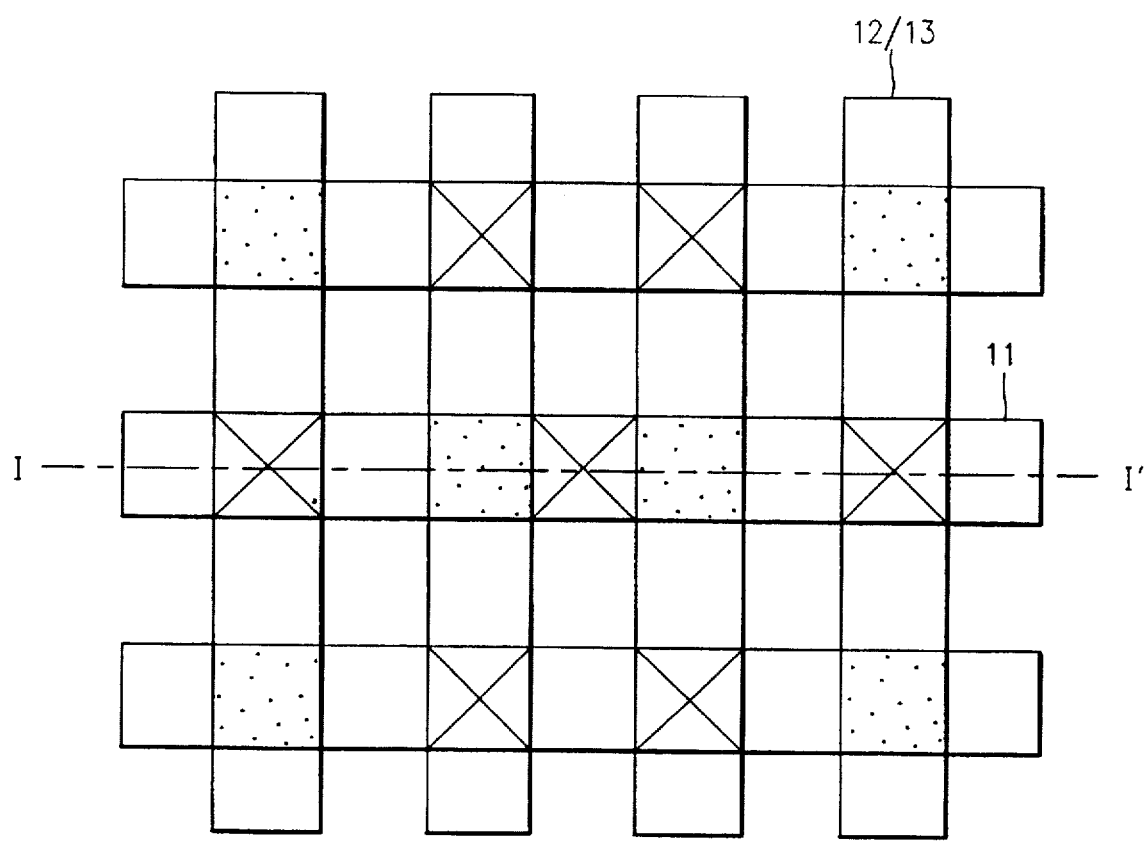
FIG. 3a is a layout of a DRAM cell according to the first embodiment of the present invention.
Figure 3B:
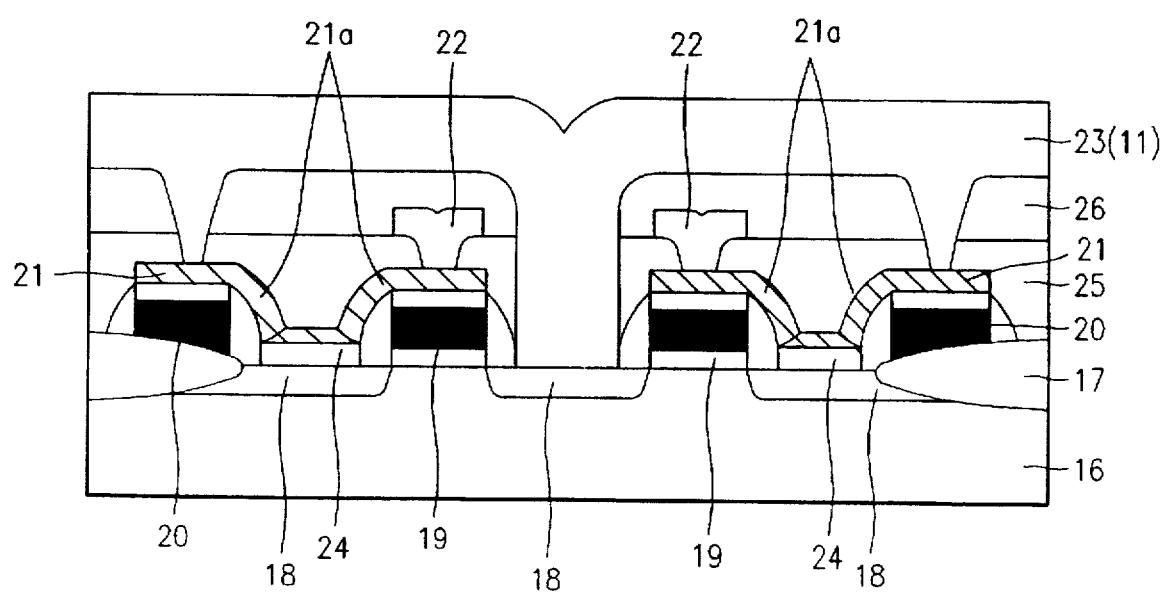

FIG. 2 is a circuit diagram of a DRAM cell according to a first embodiment of the present invention, FIG. 3a is a layout of a DRAM cell according to the first embodiment of the present invention, and FIG. 3b is a cross-sectional view of a DRAM cell taken along line I–I' in FIG. 3a. A DRAM cell in which two transistors form a cell (without a capacitor) according to the first embodiment of the present invention is constructed in a manner such that a cell comprises a first transistor 14 in which a gate electrode is connected to a word line 12 and a source electrode is connected to a bit line 11, and a second transistor 15 in which charge information corresponding to a logic '1' or '0' is stored in a gate electrode and a drain electrode is connected to a reference voltage supplying line 13. Here, bit line 11 is connected to one input terminal of a sensing amplifier (not shown), and the other input terminal thereof is connected to bit line 11 of a dummy cell, or a reference voltage supply. The drain electrode of the first transistor 14 is connected to the gate electrode of the second transistor 15.

As shown in FIGS. 3a and 3b, the aforementioned DRAM cell according to the first embodiment of the present invention includes a field oxide layer 17 formed on an isolation region of a semiconductor substrate 16; a gate electrode 20 formed on a gate insulating layer 19 formed on a predetermined portion of an active region defined by field oxide layer 17; a first impurity-diffusion region 18 formed on a portion of the semiconductor substrate 16 of both sides of the gate electrode 20; a polysilicon layer 21 formed on the gate electrode 20 and the first impurity-diffusion region 18 to be isolated therefrom; a second impurity-diffusion region 21a formed in a portion of the polysilicon layer 21 placed on the gate electrode 20; a first metal line 22 in contact with one side of the second impurity-diffusion region 21a; and a second metal line 23 in contact with the other side of the second impurity-diffusion region 21a. Here, the first impurity-diffusion region 18 functions as the source and drain regions of the first transistor 14, and the drain region of the first transistor 14 serves as a gate electrode of the second transistor (thin film transistor or TFT) 15 formed with polysilicon layer 21. The second impurity-diffusion region 21a formed in the polysilicon layer 21 functions as the source and drain regions of the second transistor 15. The first metal line 22 is a reference voltage supplying line 13 used for reading information stored in the DRAM cell shown in FIG. 2, and the second metal line 23 is the bit line 11.

A method for fabricating a DRAM cell having the above-described structure according to the first embodiment of the present invention will be explained below with reference to the accompanying drawings. Each of FIGS. 4a to 4e depicts a layout and cross-sectional view showing a process of fabricating a DRAM cell according to the first embodiment of the present invention.

Figure 4A:
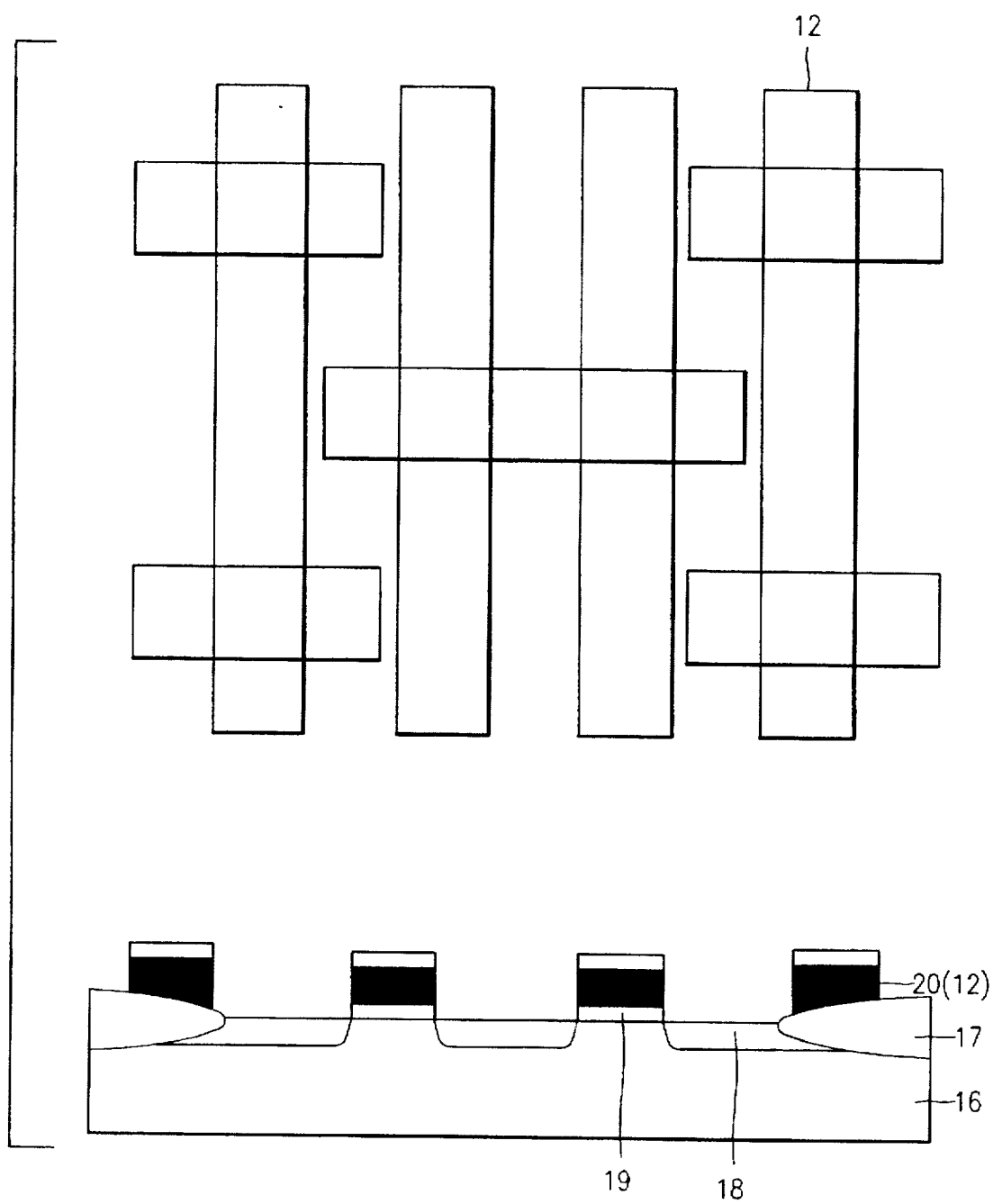

First, as shown in FIG. 4a, an oxidation stop mask layer (not shown) formed of a pad oxide layer and nitride layer is selectively formed on a semiconductor substrate 16, and heat treatment is performed at a temperature of 800° to 1100° C., to define an active region. Then, a gate oxide layer 19 is formed on the overall surface of the substrate 16, and a polysilicon layer is formed on the gate oxide layer 19 through low pressure chemical vapor deposition (LPCVD). Successively, a cap oxide layer is formed on the polysilicon layer at a thickness of 500 to 2000 Å. Photoresist (not shown) is coated on the overall surface of the substrate 16 and then patterned, and the cap oxide layer, polysilicon layer and gate oxide layer 19 are selectively etched using the patterned photoresist as a mask, to form a gate electrode 20. Then, an impurity-ion implantation is carried out using the gate electrode 20 as a mask, to form a first impurity-diffusion region 18 serving as the source and drain regions of the first transistor.

Figure 4B:
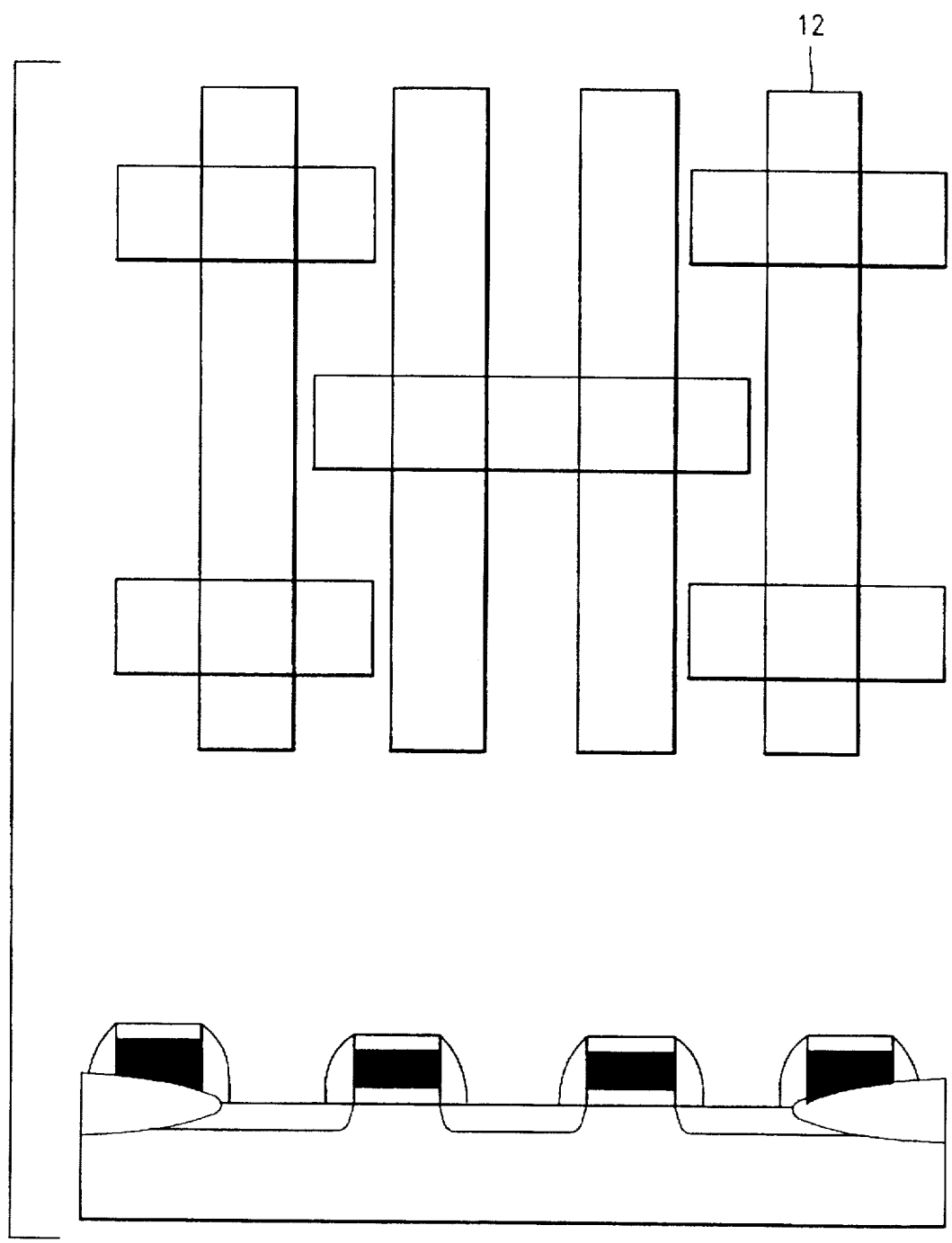
Figure 4C:
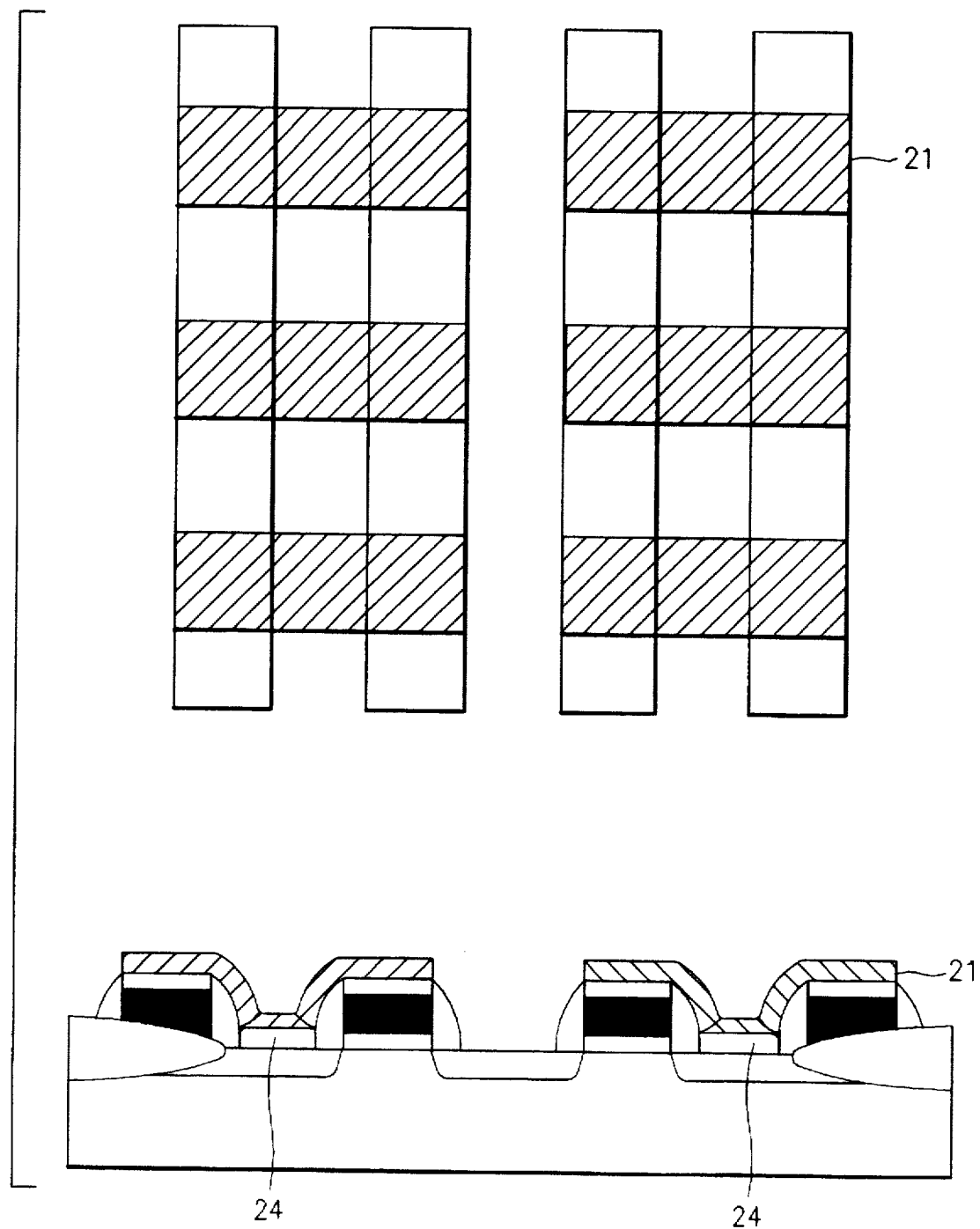

As shown in FIG. 4b, an oxide layer is formed on the overall surface of the substrate 16 and etched back, to thereby form a gate sidewall on the sides of each gate electrode 20. Then, as shown in FIG. 4c, a thermal oxidation is carried out at a temperature of 800° to 1100° C., to form a first interlevel insulating layer 24 on an exposed portion of the substrate 16 at a thickness of 50 to 200 Å, thereby electrically isolating the second transistor which will be formed in a later process step. A polysilicon layer is formed on the overall surface of the substrate through LPCVD or plasma enhanced chemical vapor deposition (PECVD) and then patterned to be left on a predetermined portion, to form a polysilicon layer 21. Photoresist (not shown) is coated on the overall surface of the substrate including the patterned polysilicon layer 21 and then patterned. Thereafter, an ion implantation is carried out into polysilicon layer 21 using the patterned photoresist as a mask, to form a second impurity-diffusion region 21a serving as the source and drain regions of the second transistor.

As shown in FIG. 4d, a second interlevel insulating layer 25 is formed on the overall surface of the substrate and selectively etched, to form a contact hole for the purpose of connecting one side of the second impurity-diffusion region 21a formed in the polysilicon layer 21 to a metal line (reference voltage supplying line) which will be formed in the following process step. Then, a conductive material is deposited on the overall surface of the substrate including the contact hole and patterned to form a first metal line 22, and a third interlevel insulating layer 26 is formed on the overall surface of the substrate.

Figure 4E:
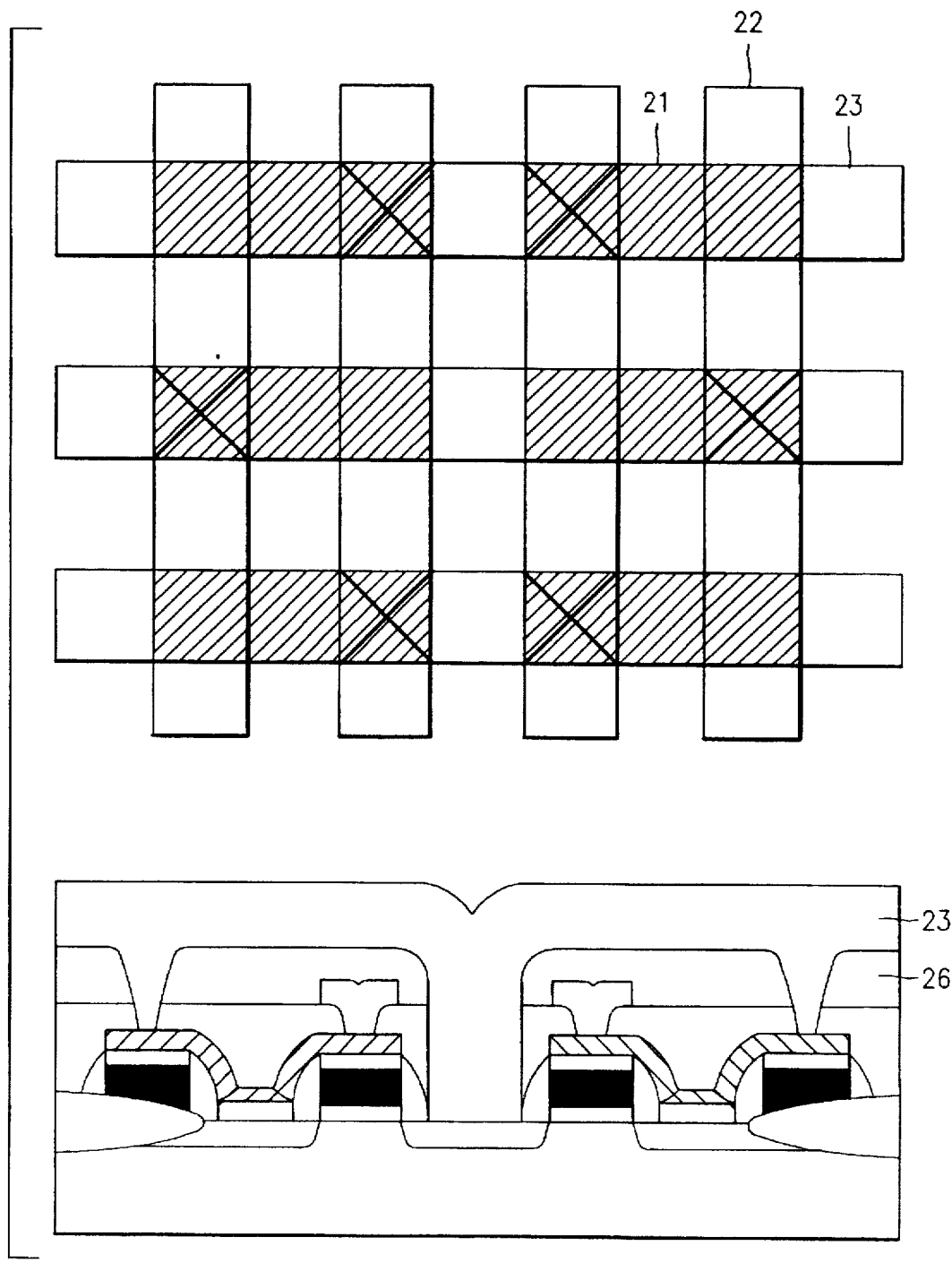

As shown in FIG. 4e, the second and third interlevel insulating layers 25 and 26 are selectively etched to form a contact hole for the purpose of connecting one side of the first impurity-diffusion region 18 and the other side of the second impurity-diffusion region 21a to a metal line which will be formed in the following process. Then, a conductive material is deposited on the overall surface of the substrate and patterned to form a second metal line 23.

The operation of the DRAM cell according to the first embodiment of the present invention will be explained below with reference to the accompanying drawings. FIGS.

5a, 5b and 5c show logic states according to the programming of the DRAM cell. First, the operation of writing binary coded information in the DRAM cell will be explained. In the standby state, the ground potential is applied to the semiconductor substrate 16, and the ground potential or a low potential is applied to all of word lines 12 so that the first and second transistors 14 and 15 are in the off-state. Accordingly, the drain electrode of the first transistor 14 is electrically cut off from the bit line 11. Here, if the reference voltage supplying line 13 is selected, and a high voltage $V_H$ ($V_H$ is a voltage above a threshold voltage required to operate the first transistor 14) is applied to the gate electrode 20 of the first transistor 14 for the purpose of performing a writing operation, a voltage $V_H-V_{TH}$ resulted from subtracting a voltage drop value $V_{TH}$ due to gate oxide layer 19 from $V_H$, is generated from the semiconductor substrate 16, thereby redistributing electrons in a portion closer to the surface of the substrate 16.

That is, electrons are accumulated to form a region made with negative charges at the interface of the substrate 16 and gate oxide layer 19, and a region made with positive charges of the same amount as that of the negative charges in the portion except for the interface, thereby forming an inversion layer under the gate oxide layer 19. Accordingly, the first transistor 14 is in the on-state so that an electrical path is formed between the source and drain regions of the first transistor 14. Here, in case a high voltage $V_H'$ is applied in order to write logic '1' in the bit line 11, the electron potential of the drain electrode is higher than that of the bit line 11. Thus, electrons migrate from the drain electrode to the bit line 11, and the electron potential of the drain electrode is decreased again if electrons completely exit the drain electrode. According to the redistribution of electrons as described above, respective electron potentials of the drain electrode and bit line are equilibrated so that electrons are not moved any more, completing the writing operation of the DRAM cell. Here, since the drain electrode of the first transistor 14 is coupled to the gate electrode of the second transistor 15, the second transistor 15 is maintained at the same potential as that of the drain electrode of the first transistor 14.

Thereafter, if the ground potential or a low voltage $V_L$ is applied to the gate electrode 20 of the first transistor 14 through the word line 12 to maintain the first transistor 14 in the off-state, 0V or a voltage $V_L-V_{TH}$ (resulted from subtracting a voltage drop value $V_{TH}$ due to gate oxide layer 19 from $V_H$), is generated from the semiconductor substrate 16, thereby redistributing electrons.

That is, electrons are depleted to form a region made with positive charges at the interface of the substrate and gate oxide layer 19, and a region formed with negative charges of the same amount as that of the positive charges in the portion except for the interface. Accordingly, the inversion layer formed on the surface of the substrate under the gate oxide layer 19 is restored to the depletion layer so as to keep the first transistor 14 in the off-state, resulting in the closing of the electrical path between the source and drain electrodes of the first transistor 14. Thus, charge information of logic '1' corresponding to $V_H'$ is stored in the gate electrode of the second transistor 15 and left there until the reading operation is performed.

The writing operation of logic '0' in a DRAM cell will be explained below. When the ground potential is applied to the semiconductor substrate 16, and the ground potential or a low potential is applied to all of word lines 12, if a high voltage $V_H$ is applied to the gate electrode 20 of the first transistor 14 through a selected word line 12, an electrical path is formed between the source and drain regions of the first transistor 14. Here, the electron potential of the drain electrode of the first transistor 14 coupled to the gate electrode of the second transistor 15 is equal to or lower than that of the bit line 11 so that electrons migrate from the bit line 11 to the drain electrode of the first transistor 14 (that is, the gate electrode of the second transistor 15), and accumulate therein. If electrons accumulate as described above, the electron potential of the drain electrode of the first transistor 14, that is, the gate electrode of the second transistor 15, is increased. As described above, if respective electron potentials of the bit line 11 and the drain electrode of the first transistor 14 are equilibrated, electrons are not moving any more, thus completing the writing operation of the DRAM cell. Thereafter, the ground potential or a low voltage $V_L$ ($V_L$ is a voltage required to allow the transistor to be in the off-state) is applied to the gate electrode 20 of the first transistor 14 through the word line 12 to keep the first transistor 14 in the off-state. As described above, if the first transistor 14 is in the off-state so that the electrical path between the source and drain regions is closed, charge information of logic '0' corresponding to the electron potential of the bit line 11 is stored in the gate electrode of the second transistor 15 and left therein until the reading operation is performed.

Next, the reading operation of the DRAM cell according to the first embodiment of the present invention will be explained below. When the ground potential is applied to the semiconductor substrate 16 and the first transistor 14 is in the off-state so that the drain electrode of the first transistor 14 and the bit line 11 are electrically cut off from each other, the reference voltage supply line 13 (the first metal line 22 shown in FIG. 3b) is selected and a reading voltage, that is, reference voltage $V_M$ ($V_M$ is a voltage above a threshold voltage required to operate the transistor) is applied to the drain electrode of the second transistor 15 through the selected reference voltage supplying line 13. Here, in case that charge information corresponding to logic '1' is stored in the gate electrode of the second transistor 15, the second transistor 15 is in the on-state due to charges corresponding to high voltage $V_H'$, which is the second transistor's own voltage, so that charge information corresponding to voltage $V_M$ is transmitted to the bit line 11. In case that charge information corresponding to logic '0' is stored in the gate electrode of the second transistor 15, the second transistor 15 is in the off-state due to charges corresponding to low voltage $V_L$ or 0V, which is the second transistor's own voltage, so that charge information corresponding to voltage logic '0' is transmitted to the bit line 11.

In the writing operation of the DRAM cell according to the first embodiment of the present invention as described above, charge information corresponding to logic '1' and '0' is stored in the gate electrode of the second transistor 15. In the reading operation, the reference voltage appears in the bit line 11 in case that charge information stored in the gate electrode of the second transistor 15 corresponds to logic '1'.

Figure 6:
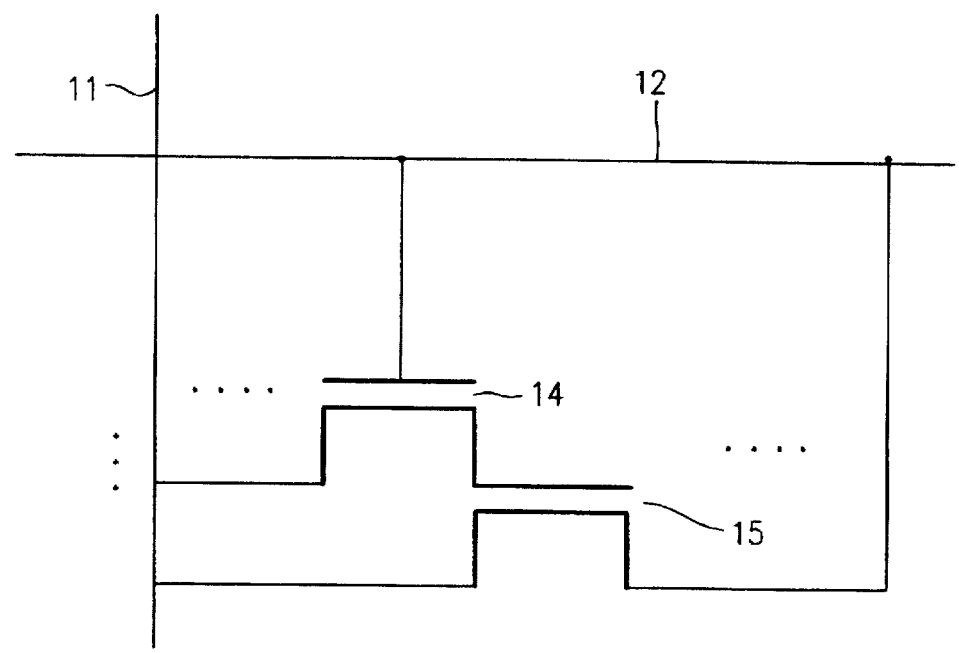
FIG. 6 is a circuit diagram of a DRAM cell according to a second embodiment of the present invention.
Figure 7A:
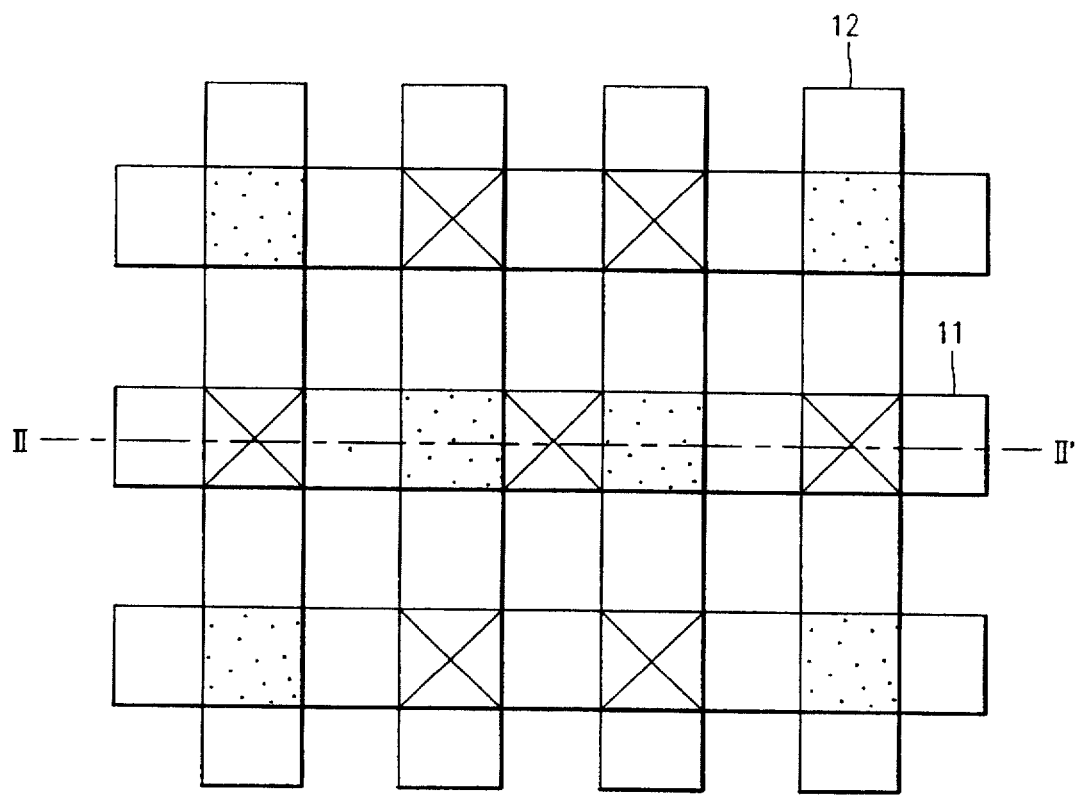
FIG. 7a is a layout of a DRAM cell according to the second embodiment of the present invention.
Figure 7B:
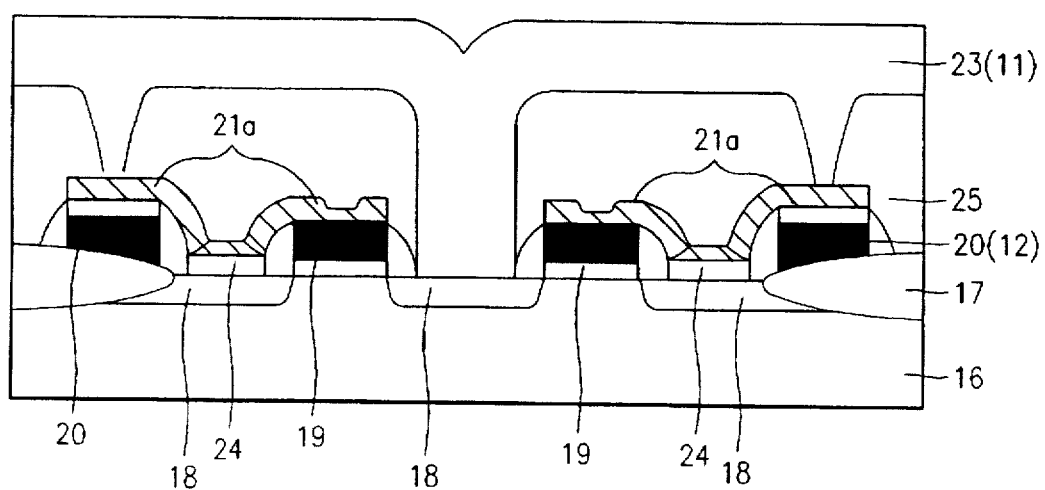

The DRAM cell having no capacitor and the method for fabricating the same according to the second embodiment of the present invention will be explained below in detail. FIG. 6 is a circuit diagram of a DRAM cell according to the second embodiment of the present invention. FIG. 7a is a layout of the DRAM cell according to the second embodiment of the present invention, and FIG. 7b is a cross-sectional view of the DRAM cell taken along line II-II' in FIG. 7a. The DRAM cell in which first and second transistors form a cell (without a capacitor) and the drain electrode of the second transistor is coupled to the word line according to the second embodiment of the present invention is constructed in a manner such that a cell consists of a first transistor 14 in which a gate electrode is connected to a word line 12 and a source electrode is connected to a bit line 11, and a second transistor 15 in which charge information corresponding to logic '1' and '0' is stored in a gate electrode and a drain electrode is connected to the word line 12. Here, the bit line 11 is connected to one input terminal of a sensing amplifier (not shown), and the other input terminal is connected to a bit line 11 of a dummy cell, or a reference voltage supply. The drain electrode of the first transistor 14 is connected to the gate electrode of the second transistor 15.

As shown in FIGS. 7a and 7b, the aforementioned DRAM cell according to the second embodiment of the present invention comprises a field oxide layer 17 formed on an isolation region of a semiconductor substrate 16; a gate electrode 20 formed on a gate insulating layer 19 formed on a predetermined portion of an active region defined by a field oxide layer 17; a first impurity-diffusion region 18 formed on a portion of the semiconductor substrate 16 at both sides of the gate electrode 20; a polysilicon layer 21 formed on the gate electrode 20 and the first impurity-diffusion region 18 to be selectively isolated therefrom; a second impurity-diffusion region 21a formed in a portion of the polysilicon layer 21 placed on the gate electrode 20; and a metal line 23 in contact with first impurity-diffusion region 18 and one side of the second impurity-diffusion region 21a. Here, the other side of the second impurity-diffusion region 21a is in contact with the gate electrode 20. The first impurity region 18 serves as the source and drain regions of the first transistor 14, and the drain region of the first transistor 14 serves as a gate electrode of the second transistor (TFT) 15 formed with the polysilicon layer 21. The second impurity-diffusion region 21a formed in the polysilicon layer 21 functions as the source and drain regions of the second transistor 15, and the metal line 23 serves as the bit line 11.

A method for fabricating a DRAM cell having the above-described structure according to the second embodiment of the present invention will be explained below with reference to the accompanying drawings. Each of FIGS. 8a to 8e depicts a layout and cross-sectional view showing a process of fabricating a DRAM cell according to the second embodiment of the present invention.

Figure 8A:
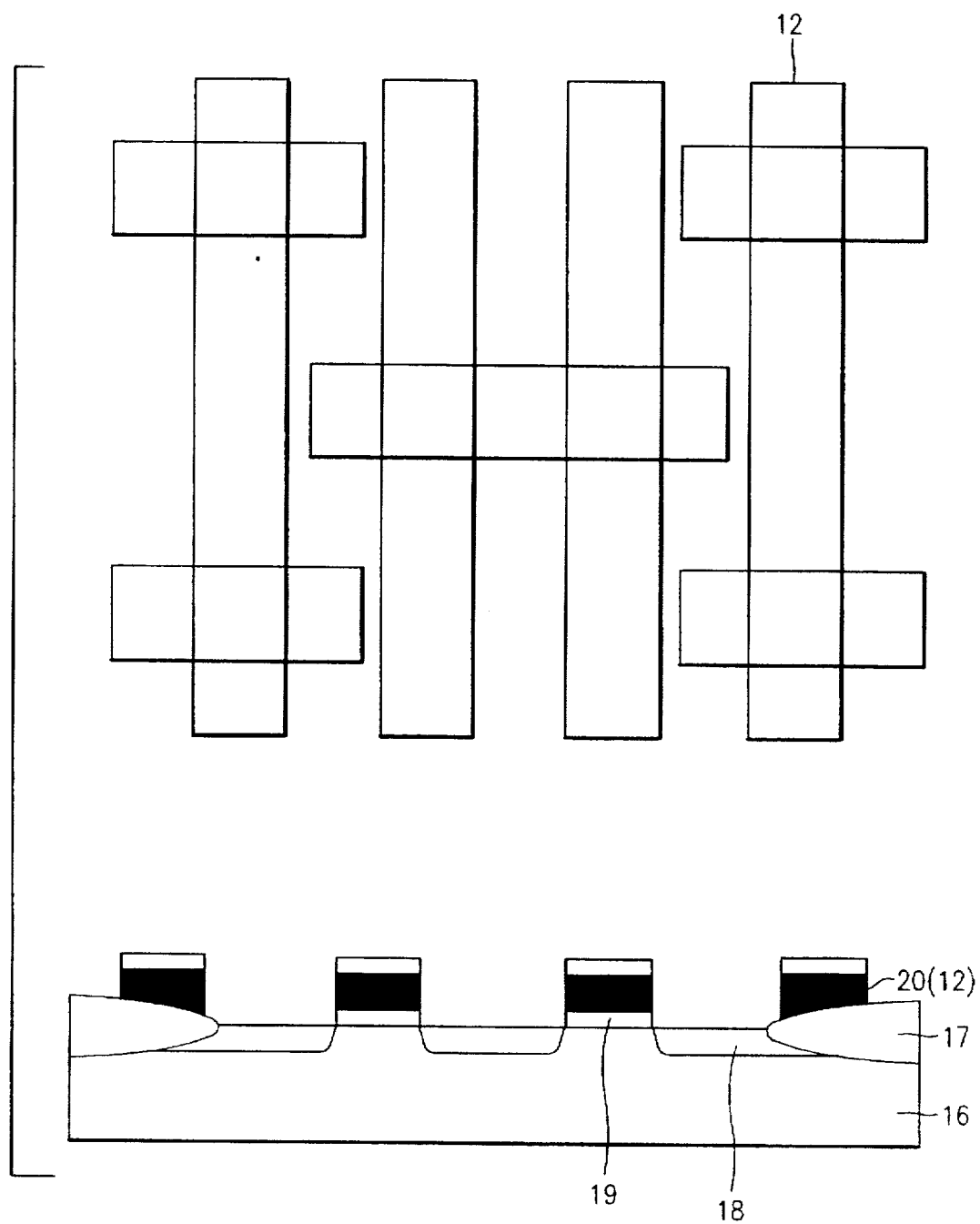

First, as shown in FIG. 8a, an oxidation stop mask layer (not shown) formed of a pad oxide layer and nitride layer is selectively formed on a semiconductor substrate 16, and heat treatment is performed at a temperature of 800° to 1100° C., to form a field oxide layer 17. By doing so, active regions are defined. Then, a gate oxide layer 19 is formed on the overall surface of the semiconductor substrate 16, and a polysilicon layer is formed on the gate oxide layer 19 through LPCVD. Successively, a cap oxide layer is formed on the polysilicon layer at a thickness of 500 to 2000 Å, and photoresist (not shown) is coated on the overall surface of the substrate 16 and then patterned. Then, the cap oxide layer, polysilicon layer and gate oxide layer 19 are selectively etched using the patterned photoresist as a mask, to form a gate electrode 20. Thereafter, an impurity-ion implantation is carried out using the gate electrode 20 as a mask, to form a first impurity-diffusion region 18 serving as the source and drain regions of the first transistor 14.

Figure 8B:
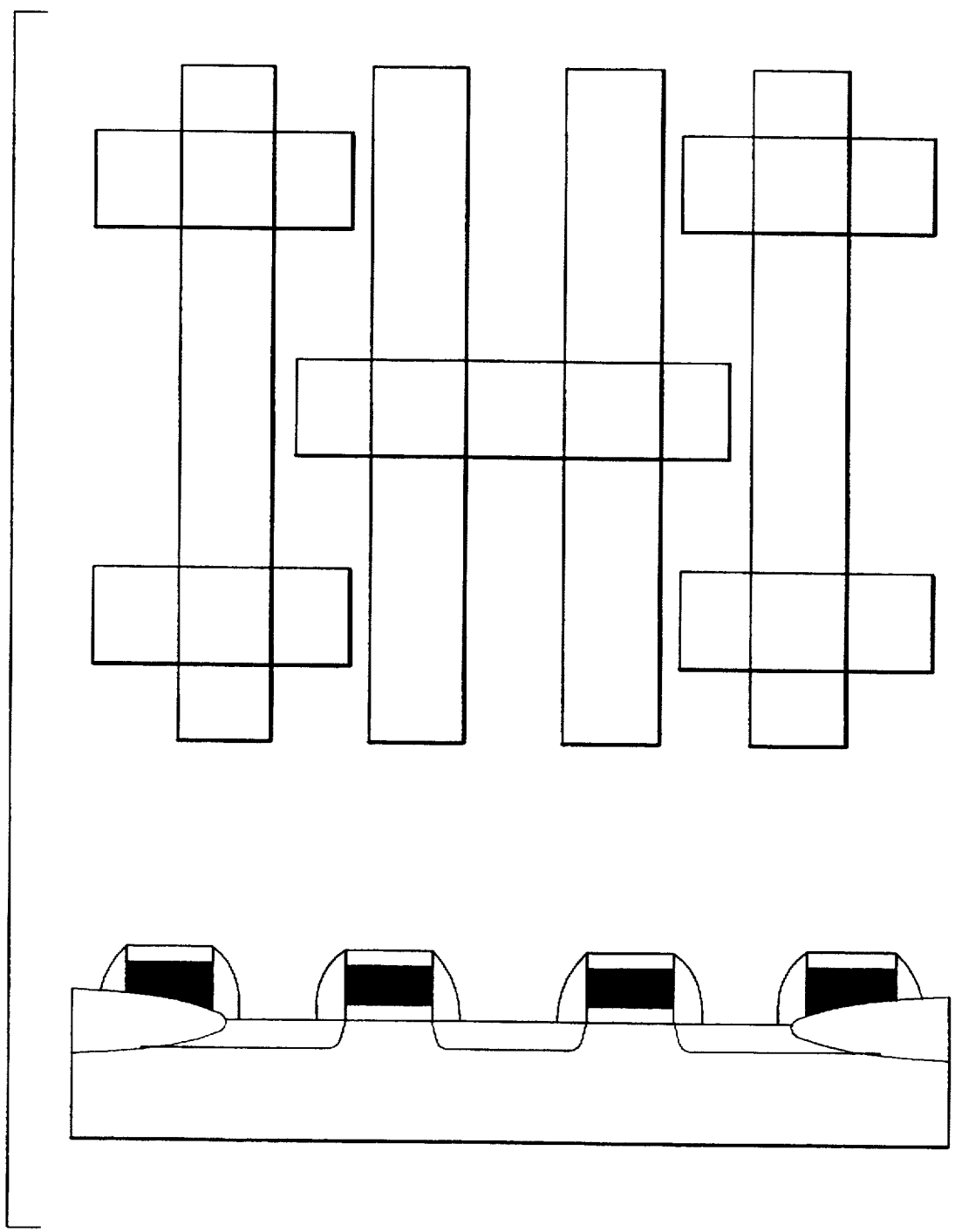
Figure 8C:
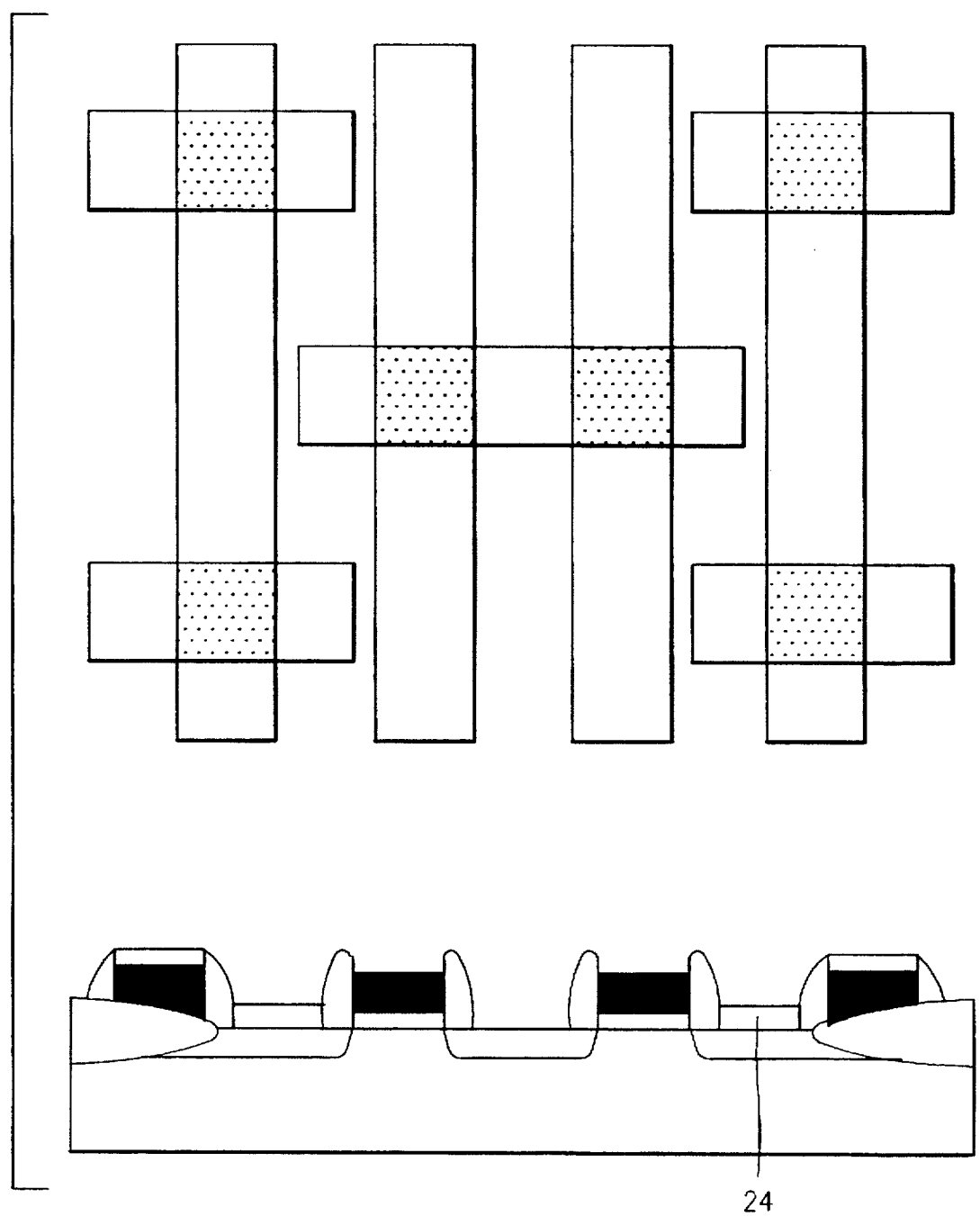

As shown in FIG. 8b, an oxide layer is formed on the overall surface of the substrate 16 and etched back, to thereby form a gate sidewall on the sides of each gate electrode 20. Then, as shown in FIG. 8c, a thermal oxidation is carried out at a temperature of 800° to 1100° C. to form a first interlevel insulating layer 24 on an exposed portion of the substrate 16 at a thickness of 50 to 200 Å, to thereby electrically isolate the second transistor which will be formed in the following process. The first interlevel insulating layer 24 on the gate electrode 20 is selectively etched to form a contact hole, and then a polysilicon layer is formed on the overall surface of the substrate through LPCVD or PECVD and patterned to be left on a predetermined portion, to form a polysilicon layer 21. Photoresist (not shown) is coated on the overall surface of the substrate including the patterned polysilicon layer 21 and patterned, and then an ion implantation is carried out into the polysilicon layer 21 using the patterned photoresist as a mask, to form a second impurity-diffusion region 21a serving as the source and drain regions of the second transistor 15.

Figure 8D:
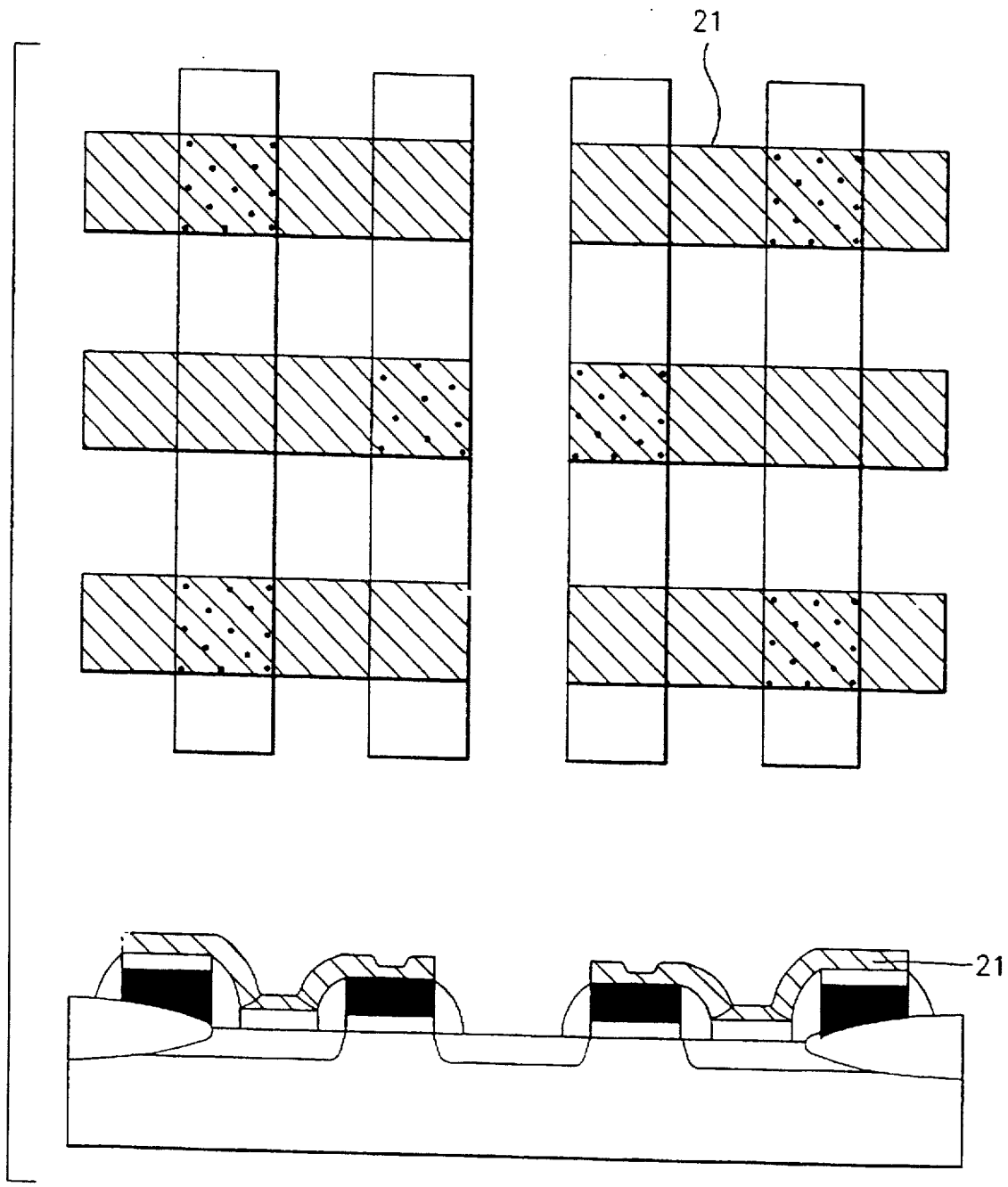

As shown in FIG. 8d, a second interlevel insulating layer 25 is formed on the overall surface of the substrate and selectively etched, to form a contact hole for the purpose of connecting one side of the second impurity-diffusion region 21a formed in the polysilicon layer 21 to a metal line which will be formed in the following process. As shown in FIG. 8e, a conductive material is deposited on the overall surface of the substrate including the contact hole and patterned to form a metal line 23.

In a DRAM cell according to the second embodiment of the present invention as described above, the drain electrode of the second transistor 15 is coupled to the word line 12, and the reading and writing operations are performed using the word line 12. That is, the writing operation is the same as that in the first embodiment of the present invention, and the reading operation is carried out in a manner such that a reading voltage (reference voltage) is applied to the drain electrode of the second transistor 15 through the word line 12.

In the aforementioned DRAM cell according to the first and second embodiments of the present invention, a voltage above the threshold voltage is applied to the gate electrode of the first transistor and the ground potential is applied to the bit line, to thereby write a logic '0'. By doing so, charge information stored in the gate electrode of the second transistor is reset to the ground potential. As described above, repeated reading and writing operations are possible using the method for either transmitting or not transmitting the reference voltage to the bit line, according to the logic value of charge information written in the unit memory cell of the capacitor-less DRAM cell of the present invention. Therefore, the DRAM cell of the present invention can be applied to various memory devices, such as a nonvolatile memory device, especially if charge information stored in the gate electrode of the second transistor leaks below the threshold voltage.

In the DRAM cell without a capacitor in accordance with the present invention, the stored logic value is read using the reference voltage so that the discrimination of the logic state in the sensing amplifier is improved, thereby increasing the reliability of the device. In addition, since the DRAM cell has no capacitor, it is not required to employ a three-dimensional structure for the purpose of increasing the capacitance. This results in an increase in the integration of the device.

It will be apparent to those skilled in the art that various modifications and variations can be made in the dynamic random access memory having no capacitor and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A capacitor-less dynamic random access memory comprising:

a first transistor having a gate electrode and source and drain electrodes;

a second transistor having a gate electrode and source and drain electrodes, wherein the drain electrode of the first transistor is used as the gate electrode of the second transistor;

a word line commonly connected to the gate electrode of the first transistor and the drain electrode of the second transistor; and a bit line commonly connected to the source electrode of the first transistor and the source electrode of the second transistor.

2. The capacitor-less dynamic random access memory as claimed in claim 1, wherein the second transistor outputs a high voltage applied to its drain electrode to the bit line only when a level of data stored therein is "HIGH".

* * * * *